(12) United States Patent
Weissman et al.

(10) Patent No.: US 8,320,687 B2
(45) Date of Patent: Nov. 27, 2012

(54) UNIVERSAL LOSSY COMPRESSION METHODS

(75) Inventors: Itschak Weissman, Palo Alto, CA (US); Shirin Jalali, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 542 days.

(21) Appl. No.: 12/701,484

(22) Filed: Feb. 5, 2010

(65) Prior Publication Data

US 2010/0195921 A1 Aug. 5, 2010

Related U.S. Application Data

(60) Provisional application No. 61/207,018, filed on Feb. 5, 2009.

(51) Int. Cl.
*G06K 9/00* (2006.01)

(52) U.S. Cl. .................................................. 382/232
(58) Field of Classification Search .................. None
See application file for complete search history.

(56) References Cited

U.S. PATENT DOCUMENTS

| 6,785,425 B1 * | 8/2004 | Feder et al. ............... 382/247 |
| 2006/0200260 A1 * | 9/2006 | Hoffberg et al. ............ 700/86 |
| 2010/0310174 A1 * | 12/2010 | Reznik ..................... 382/190 |

OTHER PUBLICATIONS

Rate-Distortion via Markov Chain Monte Carlo, by Jalali et al., IEEE Jul. 6, 2008, pp. 852-856.*

* cited by examiner

*Primary Examiner* — Vikkram Bali
(74) *Attorney, Agent, or Firm* — Stanford University; Andrea Blecken

(57) ABSTRACT

The present invention provides methods for universal lossy compression that provide performance at or near the rate-distortion limit and that are based on universal, implementable lossy source coding algorithms.

9 Claims, 2 Drawing Sheets

UNIVERSAL LOSSY COMPRESSION METHODS

RELATED APPLICATION

This application claims priority and other benefits from U.S. Provisional Patent Application Ser. No. 61/207,018, filed Feb. 5, 2009, entitled "Universal Lossy Compression Via Markov Chain Monte Carlo". Its entire content is specifically incorporated herein by reference.

STATEMENT OF GOVERNMENT SUPPORT

This invention was made with U.S. Government support under Grant No. 0546535 awarded by the National Science Foundation. The Government has certain rights in this invention.

TECHNICAL FIELD OF THE INVENTION

The present invention relates to the field of lossy source compression of data.

BACKGROUND

Rate distortion coding relates to a trade-off between communication fidelity and communication rate, where the required rate can be reduced by accepting decreased fidelity. For the special case of loss-less coding, i.e., without distortion, the minimum required communication rate is known to be the source entropy rate, and practical universal methods of lossless coding are known that provide performance at or near this limit.

When data is compressed using a loss-less method, it is possible to reconstruct the original format without losing information. Such a non-distorting compression mode is exemplified by the Lempel-Ziv method (Ziv & Lempel, 1977). Lossless compression ensures complete data fidelity and zero distortion after image or data reconstruction, which is generally very important in many scientific and medical applications such as medical imaging, image archiving, remote sensing and such, but generally requires a significant amount of costly memory and storage capacity.

As an alternative to the use of lossless compression, a lossy coding technique, i.e. non-zero distortion, may be employed. The use of lossy compression results in some loss of information, in some distortion and, therefore, in reduced information fidelity to some degree, but carries the benefit of considerably reduced storage and memory requirements and costs. In contrast to medical and scientific applications where high information fidelity is critical, applications in multimedia systems, such as TV, video (images in motion), photography (still images), can tolerate incomplete information fidelity.

In recent years, there has been progress towards designing universal lossy compressor especially in trying to tune some of the existing universal loss-less coders to work in the lossy case as well. In Kontoyiannis I, 1999, a lossy version of Lempel-Ziv algorithm at fixed distortion is rendered, and is shown to be optimal for memoryless sources.

Practical universal methods for lossy coding are needed, that provide performance at or near the rate-distortion limit, as imposed by the source statistics.

SUMMARY

The present invention features methods for universal lossy compression for application in multimedia data compression that provide performance at or near the rate-distortion limit and that are based on universal lossy source coding algorithms that, in addition to universally attaining an optimum rate-distortion tradeoff, are implementable.

Embodiments of the present invention utilize the Gibbs sampler (a Markov Chain Monte Carlo algorithm), and simulated annealing methods to achieve lossy source compression.

In all embodiments of the present invention, simulated annealing is employed to obtain a particular reconstruction sequence rather than a whole codebook.

The above summary is not intended to include all features and aspects of the present invention nor does it imply that the invention must include all features and aspects discussed in this summary.

INCORPORATION BY REFERENCE

All publications and patent applications mentioned in this specification are herein incorporated by reference to the same extent as if each individual publication or patent application was specifically and individually indicated to be incorporated by reference.

DRAWINGS

The accompanying drawings illustrate embodiments of the invention and, together with the description, serve to explain the invention. These drawings are offered by way of illustration and not by way of limitation; it is emphasized that the various features of the drawings may not be to-scale.

DEFINITIONS

Figure 1:
FIG. 1 illustrates an original image with an empirical conditional entropy of 0.1025.

Unless defined otherwise, all technical and scientific terms used herein have the same meaning as commonly understood by a person of ordinary skill in the art to which this invention belongs. The following definitions are intended to also include their various grammatical forms, where applicable.

The term "distortion", as used herein, describes the alteration of an original characteristic, such as the shape, of an object, image, sound or other form of representation.

The term "fidelity", as used herein, describes to which degree a reproduction reflects the state and characteristics of a real world object, image, sound or other form of representation.

The term "data compression" or "compression", as used herein, is the process of encoding information using fewer information-bearing units such as bits compared than an unencoded format would use.

The term "bit", as used herein, describes a basic unit of information in computing and telecommunication; it is the amount of information that can be stored by a device or system.

The term "data", as used herein, describes information including but not limited to speech, voice, audio, images, still images, images in motion, video, movies, and sound.

DETAILED DESCRIPTION

The present invention features methods for universal lossy compression that provide performance at or near the rate-distortion limit and that are based on universal lossy source coding algorithms that, in addition to universally attaining an optimum rate-distortion tradeoff, are implementable.

Embodiments of the present invention utilize the Gibbs sampler (a Markov Chain Monte Carlo algorithm), and simulated annealing methods to achieve lossy source compression.

In certain embodiments of the present invention, simulated annealing is employed to obtain a particular reconstruction sequence rather than a whole codebook.

In all embodiments, the methods of the present invention are applicable to stationary ergodic sources.

Need for Compression of Digitalized Data

Whereever large volumes of digitized data are handled, data compression is indispensable, since it reduces storage requirements and time required to transmit, download or upload those images or data. Compression is the efficient digital representation of a source signal, such as voice, still images, images in motion (video/movie), music in as little number of bits as possible, while still retaining an acceptable version of the original source signal, and can be carried with lossless or lossy methodologies. The source can be any data including but not limited to still images, speech, voice, audio, images in motion, video, movies, and sound.

Lossless compression ensures complete data fidelity and zero distortion after image or data reconstruction, which is generally very important in many scientific and medical applications such as medical imaging, image archiving, remote sensing and such, but does not yield a significant reduction in storage and transmission of the source signal. The use of lossy compression results, within a certain range, in some loss of information, in some distortion and, therefore, in reduced information fidelity to some degree, but carries the benefit of considerably reduced storage and memory requirements and costs. In contrast to medical and scientific applications where high information fidelity is critical, applications in multimedia systems, such as TV, video (images in motion), photography (still images), can tolerate incomplete information fidelity.

Digital multimedia compression including video and still image compression

Digital signals (including data and images) are easy to store and easy to transmit, download or upload, but require significant and costly storage capacity.

In contrast to medical and scientific applications where high information fidelity is critical, applications in multimedia systems, including but not limited to TV/High Definition TV (HDTV), videos/movies (images in motion), photography (still images), voice (audio, telecommunication), music, can tolerate incomplete information fidelity and, therefore, data as well as images and signals from multimedia applications can be compressed using lossy methodologies. Still-image compression for image storage and retrieval, as well as video compression for video telephony and videoconferencing applications are examples for the application of lossy compression methodologies.

Ergodic Sources

A nonhomogeneous Markov chain is called strongly ergodic if there exists a distribution over the state space Any strongly ergodic MC is also weakly ergodic due to triangle inequality. A stationary ergodic source is a source i) whose characteristics do not change over time, ii) having only one realization of it enables us to calculate all statistics of the source.

Markov Chain Monte Carlo (MCMC) Methods

MCMC methods refer to a class of algorithms that are designed to generate samples of a given distribution through generating a Markov chain having the desired distribution as its stationary distribution. MCMC methods include a large number of algorithms. In embodiments of the present invention, the Gibbs Sampler, also known as the heat bath algorithm, is utilized, which is well-suited to the case where the desired distribution is hard to compute, but the conditional distributions of each variable given the rest are easy to work out.

Gibbs Sampler

The Gibbs sampler, an example of a Markov Chain Monte Carlo (MCMC) algorithm, is a computing-intensive algorithm to generate a sequence of samples from the joint (marginal) probability distribution of two or more random variables. The purpose of such a sequence is to approximate the joint distribution, or to compute an integral such as an expected value. Gibbs sampling is applicable when the joint distribution is not known explicitly, but the conditional distribution of each variable is known. The usefulness of the Gibbs sampler increases greatly, as the dimension of a problem increases, because the Gibbs sampler allows to avoid calculating difficult integrals, which can be prohibitively difficult in high dimension (Casella & George, 1992).

Simulated Annealing

Simulated annealing is an optimization method to find a good approximation to the global minimum of a given function along with the minimizing state $s_{min}$ over a set of possibly. In embodiments of the present invention, probability distributions are designed such that: 1) their output, with high probability, is the minimizing state $s_{min}$, or one of the states close to it, 2) the probability of getting the minimizing state increases as the temperature drops. The probability distribution that satisfies these characteristics, is the Boltzman distribution, as laid out in Appendices A and B. It can be proven that using Boltzman distribution, if the temperature drops slowly enough, the probability of ultimately getting the minimizing state as the output of the algorithm approaches one (Geman & Geman, 1984).

Lossy Source Coding

A reconstruction sequence is sampled from a Boltzmann distribution associated with an energy function that incorporates (a) the distortion between the source and reconstruction; (b) the compressibility of the reconstruction; and (c) the point sought on the rate-distortion curve.

To sample from this distribution, a heat bath algorithm is used, starting with initial candidate reconstruction such as the original source sequence. At every iteration, an index $\bar{i}$ is chosen and the ith sequence component is replaced by drawing from the conditional probability distribution for that component given all the rest. At the end of this process, the encoder losslessly conveys the reconstruction to the decoder using universal lossless compression.

An appropriate choice of the energy function leads to an algorithm whose complexity, in each iteration, is independent of the sequence length and only linearly dependent on a certain context parameter k (which grows sub-logarithmically with the sequence length).

The algorithm is universal: for any stationary ergodic source, it achieves the optimal rate-distortion performance in the limits of large number of iterations and sequence length.

Applicability to Small Sized Source Alphabets

Embodiments of the present invention are based on algorithms that are primarily applicable to cases where the size of the reconstruction alphabet is small. The reason is twofold: First, for larger alphabet sizes the contexts will be too sparse to give a true estimate of the empirical entropy of the reconstruction block, even for small values of the context parameter k. Second, the size of the count matrix m grows exponentially with the context parameter k, but polynomially with the size of the source alphabet which makes storing it for large values of the source alphabet impractical.

EXAMPLES

The following examples are put forth so as to provide those of ordinary skill in the art with a complete disclosure and description of how to make and use the present invention; they are not intended to limit the scope of what the inventors regard as their invention.

Example 1

(Near Optional) Lossy Source Coding and Compression-Based Denoising via Markov Chain Monte Carlo An implementable new universal lossy source coding algorithm is proposed. The new algorithm utilizes two well-known tools from statistical physics and computer science: Gibbs sampling and simulated annealing. In order to code a source sequence $x^n$, the encoder initializes the reconstruction block as $y^n=x^n$, and then at each iteration uniformly at random chooses one of the symbols of $y^n$, and updates it. This updating is based on some conditional probability distribution which depends on a parameter $\beta$ representing inverse temperature, an integer parameter $k=o(\log n)$ representing context length, and the original source sequence. At the end of this process, the encoder outputs the Lempel-Ziv description of $y^n$, which the decoder deciphers perfectly, and sets as its reconstruction. The complexity of the proposed algorithm in each iteration is linear in k and independent of n. We prove that, for any stationary ergodic source, the algorithm achieves the optimal rate-distortion performance asymptotically in the limits of large number of iterations, $\beta$, and n. Finally, this particular approach finds application to universal Wyner-Ziv coding and compression-based denoising.

Fixed Slope Rate-Distortion Scheme

Instead of working at a fixed rate or at a fixed distortion, the slope is fixed. A fixed slope rate-distortion scheme, for a fixed slope $s<0$, looks for the coding scheme that minimizes $R-s\cdot D$, where as usual R and D denote the rate and the average expected distortion respectively. In comparison to a given coding scheme of rate R and expected distortion D, for any $0<\delta<R-R(X,D)$, there exists a code which works at rate $R(X,D)+\delta$ and has the same average expected distortion, and consequently a lower cost. Therefore, it follows that any point that is optimal in the fixed-slope setup corresponds to a point on the rate-distortion curve.

Conclusion

A new implementable universal lossy source coding algorithm based on simulated annealing Gibbs sampling is described that it is capable of getting arbitrarily close to the rate-distortion curve of any stationary ergodic source. For coding a source sequence $x^n$, the algorithm starts from some initial reconstruction block, and updates one of its coordinates at each iteration. The algorithm can be viewed as a process of systematically introducing 'noise' into the original source block, but in a biased direction that results in a decrease of its description complexity. This new method was shown to be successfully applied to universal WZ coding and universal denoising including large class of sources such as i.i.d sources and those satisfying the Shannon lower bound with equality.

Appendix A describes the approach in detail including proof, notations/nomenclature, count matrix and empirical conditional entropy of a sequence, exhaustive search scheme for fixed-slope lossy compression that universally achieves the rate-distortion curve for any stationary ergodic source and universal MCMC-based lossy coder. Appendix A further describes the application of this approach to universal Wyner-Ziv coding and universal compression-based denoising.

Example 2

Rate-Distortion via Markov Chain Monte Carlo

A reconstruction sequence is sampled from a Boltzmann distribution associated with an energy function that incorporates the distortion between the source and reconstruction, the compressibility of the reconstruction, and the point sought on the rate-distortion curve. To sample from this distribution, we use a heat bath algorithm: Starting from an initial candidate reconstruction (e.g., the original source sequence), at every iteration, an index i is chosen and the ith sequence component is replaced by drawing from the conditional probability distribution for that component given all the rest. At the end of this process, the encoder losslessly conveys the reconstruction to the decoder using universal lossless compression.

An appropriate choice of the energy function leads to an algorithm whose complexity, in each iteration, is independent of the sequence length and only linearly dependent on a certain context parameter (which grows sub-logarithmically with the sequence length). The algorithm is universal: for any stationary ergodic source, it achieves the optimal rate-distortion performance in the limits of large number of iterations and sequence length.

As laid out in detail in Appendix B, applying the algorithm to generate a reconstruction at the encoder, followed by losslessly describing the reconstruction to the decoder using LZ compression, yields an overall scheme which universally attains the optimum rate-distortion performance at slope s for any stationary and ergodic process.

CONCLUSION

An implementable universal lossy source coding algorithm based on Gibbs sampling and simulated annealing was developed that is capable of getting arbitrarily close to the rate-distortion curve of any stationary ergodic source.

For coding a source sequence $x^n$, the algorithm starts from some initial reconstruction block, and updates one of its coordinates at each iteration. The algorithm can be viewed as a process of introducing 'noise' into the original source block, but in a biased direction that results in a decrease of its lossless description length and complexity.

The algorithm can also be used in the non-universal setup, where the optimal achievable rate-distortion tradeoff may be known in advance. In such cases, this extra information can be used as a stopping criterion for the algorithm.

Example 3

Lossy Compression of Binary Images (Binary Source Alphabets)

Figure 2:
FIG. 2 shows a reconstructed image with an empirical conditional entropy of 0.0600 and an average distortion of 0.0337 per pixel ($r=50$ $n^2$, $s=-0.1$, $\beta$ $(t)=0.1$ log $(t)$).

FIGS. 1 and 2 exemplify, in accordance to embodiments of the present invention, the application of lossy compression methods of the present invention to binary images and binary images in motion, such as in a video. In this particular n×n binary image, n=252. FIG. 1 shows the original image, while FIG. 2 shows the coded version after $r=50$ $n^2$ iterations. The parameters are $s=-0.1$, and $\beta(t)=0.1\log(t)$. The empirical conditional entropy of the image has decreased from $H_k=0.1025$ to $H_k=0.0600$ in the reconstruction image, while an average distortion of $D=0.0337$ per pixel is introduced.

Although the foregoing invention and its embodiments have been described in some detail by way of illustration and example for purposes of clarity of understanding, it is readily apparent to those of ordinary skill in the art in light of the teachings of this invention that certain changes and modifications may be made thereto without departing from the spirit or scope of the appended claims. Accordingly, the preceding merely illustrates the principles of the invention. It will be appreciated that those skilled in the art will be able to devise various arrangements which, although not explicitly described or shown herein, embody the principles of the invention and are included within its spirit and scope.

REFERENCES

Casella G. & George E. I. (1992), "Explaining the Gibbs sampler," The American Statistician 46, pp. 167-174;

Geman S. & Geman D. (1984), "Stochastic Relaxation, Gibbs Distributions, and the Bayesian Restoration of Images," IEEE Trans. on Pattern Analysis and Machine Intelligence 6, pp. 721-741;

Kontoyiannis I. (1999), "An implementable lossy version of the Lempel-Ziv algorithm—Part I: optimality for memoryless sources," IEEE Trans. Inform. Theory 45, pp. 2293-2305;

Ziv J. & Lempel A (1977), "A universal algorithm for sequential data compression," IEEE Trans. Inform. Theory 23, pp. 337-343.

What is claimed is:

1. A lossy data compression method, the method comprising:
    receiving data from a source alphabet to be encoded, the source alphabet including one or more symbols; assigning coded bits to each symbol of the received data based on a probability distribution, wherein the probability distribution is obtained by sampling a sequence for reconstruction from a Boltzmann distribution associated with an energy function, the energy function depending on distortion between the source alphabet and the reconstruction; the energy function further depending on the reconstruction being compressible and on the desired distortion between the source alphabet and the reconstruction.

2. The method of claim 1, further comprising: receiving compressed data, the compressed data including the coded bits representing the received data; and decoding the compressed data to recover and reconstruct each symbol of the received data based on the probability distribution.

3. The method of claim 1, wherein assigning coded bits to each symbol of the received data based on a probability distribution comprises, at every iteration, the selection of an index I and replacement of the i-th sequence component.

4. The method of claim 1, wherein the source alphabet is of small size.

5. The method of claim 1, wherein the source alphabet is binary.

6. The method of claim 1, wherein the lossy compression is sought for data for which no statistical characteristics are known.

7. The method of claim 1, wherein the receiving/received data are still images.

8. The method of claim 1, wherein the receiving/received data are images in motion including video and movies.

9. The method of claim 1, wherein the receiving/received data are sounds including speech, voice and audio.

* * * * *